United States Patent
Miyamura et al.

(10) Patent No.: US 9,508,432 B2
(45) Date of Patent: Nov. 29, 2016

(54) SEMICONDUCTOR DEVICE WITH VARIABLE RESISTANCE SWITCH AND PROGRAMMING METHOD THEREFOR

(71) Applicant: NEC Corporation, Tokyo (JP)

(72) Inventors: Makoto Miyamura, Tokyo (JP); Toshitsugu Sakamoto, Tokyo (JP); Munehiro Tada, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/410,261

(22) PCT Filed: Feb. 28, 2013

(86) PCT No.: PCT/JP2013/001209
§ 371 (c)(1),
(2) Date: Dec. 22, 2014

(87) PCT Pub. No.: WO2013/190741
PCT Pub. Date: Dec. 27, 2013

(65) Prior Publication Data
US 2015/0131358 A1   May 14, 2015

(30) Foreign Application Priority Data

Jun. 20, 2012   (JP) ................. 2012-139062

(51) Int. Cl.
| | |
|---|---|
| *G11C 5/06* | (2006.01) |
| *G11C 13/00* | (2006.01) |
| *H01L 27/10* | (2006.01) |
| *H03K 19/00* | (2006.01) |
| *H01L 27/24* | (2006.01) |
| *H01L 45/00* | (2006.01) |

(52) U.S. Cl.
CPC ............ *G11C 13/0069* (2013.01); *G11C 5/06* (2013.01); *G11C 13/0002* (2013.01); *G11C 13/0023* (2013.01); *G11C 13/0038* (2013.01); *H01L 27/101* (2013.01); *H01L 27/2463* (2013.01); *H01L 45/1253* (2013.01); *H03K 19/0013* (2013.01); *G11C 2013/0073* (2013.01); *G11C 2213/15* (2013.01); *H01L 45/08* (2013.01)

(58) Field of Classification Search
USPC ................. 365/148, 158, 163, 171, 173, 27
See application file for complete search history.

(56) References Cited

U.S. PATENT DOCUMENTS

| | | | | |
|---|---|---|---|---|
| 2005/0045919 | A1* | 3/2005 | Kaeriyama | ......... G11C 11/5614 257/211 |
| 2006/0056250 | A1* | 3/2006 | Miura | ..................... B82Y 10/00 365/202 |
| 2010/0213433 | A1* | 8/2010 | Yamamoto | ......... G11C 13/0007 257/4 |

FOREIGN PATENT DOCUMENTS

| | | |
|---|---|---|
| JP | 2005-101535 | 4/2005 |
| WO | 2012032937 | 3/2012 |
| WO | 2012043502 | 4/2012 |

OTHER PUBLICATIONS

International Search Report PCT/JP2013/001209 dated Mar. 26, 2013.

Shunichi Kaeriyama et al., "A Nonvolatile Programmable Solid-Electrolyte Nanometer Switch", IEEE Journal of Solid-State Circuits, vol. 40, No. 1, pp. 168 to 176, Jan. 2005.

* cited by examiner

*Primary Examiner* — Tha-O H Bui
(74) *Attorney, Agent, or Firm* — Young & Thompson

(57) ABSTRACT

This semiconductor device is provided with: a variable resistance first switch (103), which has a first terminal and a second terminal, and which has the resistance value thereof varied when an applied voltage exceeds a reference value; a variable resistance second switch (104), which has a third terminal and a fourth terminal, and which forms an intermediate node (105) by having the third terminal connected to the second terminal, and has the resistance state thereof varied when an applied voltage exceeds a reference value; first wiring (101) connected to the first terminal; second wiring (102), which is connected to the fourth terminal, and which extends in the direction intersecting the first wiring (101) in a planar view; a first selection switch element (106) connected to the first wiring (101); and a second selection switch element (107) connected to the second wiring (102).

16 Claims, 11 Drawing Sheets

Fig. 1
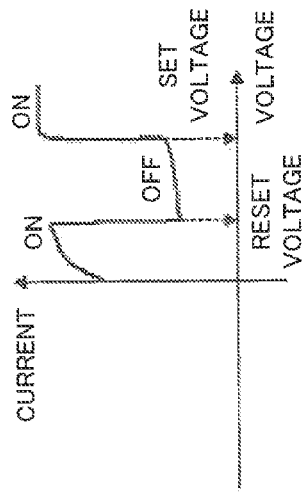
Fig. 1A
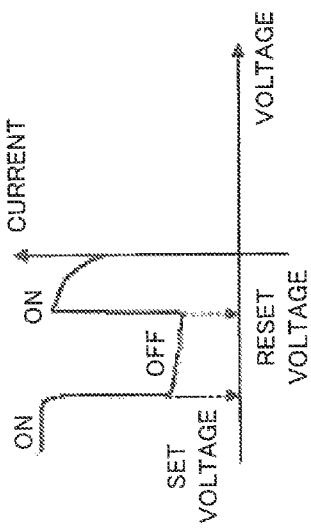
Fig. 1B
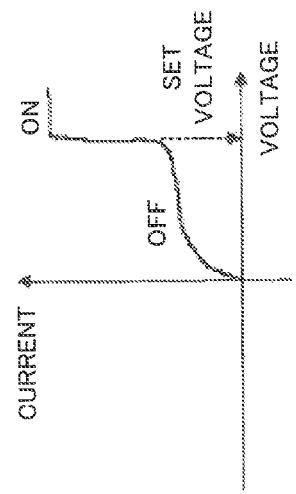
Fig. 1C
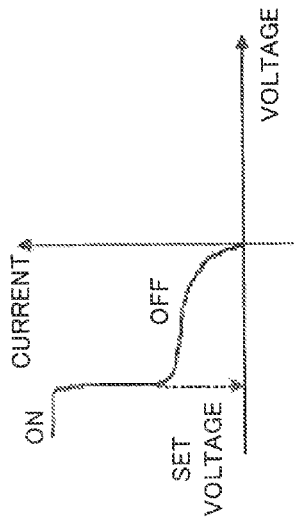
Fig. 1D

Fig. 2

SEMICONDUCTOR DEVICE WITH VARIABLE RESISTANCE SWITCH AND PROGRAMMING METHOD THEREFOR

TECHNICAL FIELD

The present invention relates to a semiconductor device and in particular, relates to a semi conduct or device mounting a variable resistance nonvolatile element (hereinafter, referred to as a switch element) and a programming method therefor.

BACKGROUND ART

With the miniaturization of a semiconductor integrated circuit, an integration degree of a field effect transistor (MOSFET: Metal Oxide Semiconductor Field Effect Transistor) increases at a pace of four times in three years. In such situation, an opportunity in which a designer uses a programmable semiconductor device such as an FPGA (Field Programmable Gate Array) or the like that can be electrically programmed by the designer to realize a desired circuit in a manufactured semiconductor chip increases.

However, it is known that when the same function is realized by using the FPGA or a custom-designed semiconductor device, the FPGA requires a lot of transistors whose number is greater than the number of transistors used in the custom-designed semiconductor device by one or more orders of magnitude. Therefore, a currently available FPGA has a problem in which an area efficiency is low and a power consumption becomes large. In recent years, a study in which an overhead of the FPGA is reduced by realizing a programmable wiring by mounting a variable resistance element in a multi-layered wiring layer and whereby electric power is saved and the power consumption is reduced is being performed.

As the variable resistance element, an ReRAM (Resistance Random Access Memory) using a transition metal oxide, Nano Bridge (registered trademark of NEC) using an ion conductor, or the like is used. In patent literature 1 and non-patent literature 1, a variable resistance element which uses the movement of a metal ion in a solid (ion conductor) in which an ion can freely move when an electric field or the like is applied and the electrochemical reaction is disclosed. The variable resistance element disclosed in patent literature 1 and non-patent literature 1 is composed of an ion conduction layer, and a first electrode and a second electrode which contact with the ion conduction layer and are provided on a facing surface. In the variable resistance element disclosed in patent literature 1 and non-patent literature 1, the metal ion is supplied from the first electrode to the ion conduction layer and the metal ion is not supplied from the second electrode to the ion conduction layer. In the variable resistance element disclosed in patent literature 1 and non-patent literature 1, a resistance value of the ion conductor is changed by changing a polarity of the applied voltage and whereby, a state of conduction between two electrodes is controlled. In patent literature 1 and non-patent literature 1, a crossbar switch in which the variable resistance element is used in an ULSI (Ultra-Large Scale Integration) is disclosed.

CITATION LIST

Patent Literature

[PTL 1] Japanese Patent Application Laid-Open No. 2005-101535

Non Patent Literature

[NPL 1] Shuniehi Kaeriyaina et al., "A Nonvolatile Programmable Solid-Electrolyte Nanometer Switch". IEEE Journal of Solid-State Circuits, Vol. 40, No. 1, pp. 168 to 176, January 2005.

SUMMARY OF INVENTION

Technical Problem

However, the variable resistance element described in patent literature 1 and non-patent literature 1 has the following problem. In the crossbar switch in which a two terminal type variable resistance element described in patent literature 1 and non-patent literature 1 is used for a signal line of the ULSI, a problem (OFF disturbing problem) in which erroneous writing to the variable resistance element that is in a high resistance state occurs by a logical amplitude of the signal occurs. In particular, there is a problem such that, when a programming voltage of the variable resistance element is lowered so as to match an operating voltage of a logic LSI, the above-mentioned disturbing problem becomes remarkable.

An object of the present invention is to provide a semiconductor device, especially to provide a crossbar switch, which can prevent the occurrence of the off disturbing problem and realize high reliability.

Solution to Problem

By the present invention, a semiconductor device comprising a variable resistance first switch which includes a first terminal and a second terminal and whose resistive state changes when a predetermined condition is satisfied after the electric power is applied, a variable resistance second switch which includes a third terminal and a fourth terminal and configures an intermediate node by connecting the third terminal and the second terminal, and whose resistive state changes when the predetermined condition is satisfied after the electric power is applied, a first wiring which is connected to the first terminal, a second wiring which is connected to the fourth terminal and extends in a direction intersecting with the first wiring in a planar view, a first selection switch element which is connected to the first wiring, and a second selection switch element which is connected to the second wiring is provided.

By the present invention, a programming method in which a semiconductor device including a variable resistance first switch which includes a first terminal and a second terminal and whose resistive state changes when a predetermined condition is satisfied after the electric power is applied and a variable resistance second switch which includes a third terminal and a fourth terminal and configures an intermediate node by connecting the third terminal and the second terminal, and whose resistive state changes when the predetermined condition is satisfied after the electric power is applied is prepared and, the semiconductor device applies a voltage or a current between the first terminal and the fourth terminal so that the first switch and the second switch satisfy the condition and programs a unit element composed of the first switch and the second switch by changing the resistive states of the first switch and the second switch is provided.

Advantageous Effects of Invention

By the present invention, a semiconductor device which can prevent the occurrence of the OFF disturbing problem and realize high reliability can be provided.

BRIEF DESCRIPTION OF DRAWINGS

Further, the above-mentioned object, the other object, features, and advantages of the present invention will be apparent from the following description of the preferred embodiments and the following accompanying drawings thereof, in which FIGS. 1A, 1B, 1C, and 1D are figures showing operating characteristic of a unipolar switch.

DESCRIPTION OF EMBODIMENTS

Figure 2A:
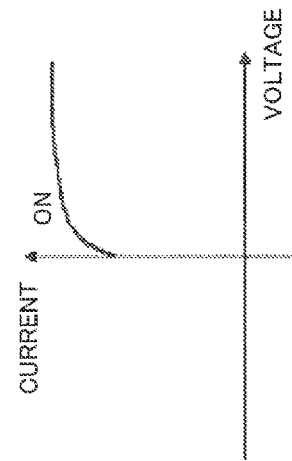
FIGS. 2A, 2B, 2C, and 2D are figures showing operating characteristic of a bipolar switch.

An exemplary embodiment of the present invention will be described below by using the drawing. Further, the same reference numbers are used for the elements having the same function in all the drawings and the description of the element is omitted appropriately.

Terminology related to the present invention will be described before explaining the present invention in detail.

(Explanation of Bipolar Switch and Unipolar Switch)

(Unipolar Switch)

The unipolar switch is a switching element whose resistive state can be switched between an OFF state (high-resistance state) and an ON state (low-resistance state) by an applied voltage value.

The operating characteristic of the unipolar switch will be described by using FIG. 1. FIG. 1 is a figure showing the operating characteristic of the unipolar switch.

It is assumed that the unipolar switch has a structure in which a variable resistance layer is sandwiched between a first electrode and a second electrode. When a positive voltage is applied to the first electrode and the voltage value exceeds a predetermined set voltage, the state of the unipolar switch changes from the OFF state to the ON state (FIG. 1A).

Further, the set voltage and a reset voltage described later are characteristic values determined depending on a film thickness, a composition, a density, and the like of the variable resistance layer. A voltage at which the resistive state of the variable resistance layer changes from the high-resistance state (OFF state) to the low-resistance state (ON state) is the set voltage and a voltage at which the resistive state of the variable resistance layer changes from the low-resistance state (ON state) to the high-resistance state (OFF state) is the reset voltage.

When a voltage higher than the reset voltage is applied to the unipolar switch whose state is the ON state, the state of the unipolar switch is changed from the ON state to the OFF state. Further, when the applied positive voltage is increased and the applied voltage value exceeds the set voltage, the state of the unipolar switch changes from the OFF state to the ON state (FIG. 1B).

On the other hand, when a negative voltage is applied to the first electrode and the applied voltage value exceeds the set voltage, the state of the unipolar switch changes from the OFF state to the ON state (FIG. 1C).

In the unipolar switch whose state is the ON state, when the negative voltage value applied to the first electrode exceeds the reset voltage, the state of the unipolar switch changes from the ON state to the OFF state. Further, when the negative voltage value applied to the first electrode exceeds the set voltage, the state of the unipolar switch is changed from the OFF state to the ON state again (FIG. 1D).

Thus, the unipolar switch does not operate depending on the polarity of the applied voltage. It operates depending on only the applied voltage value. The unipolar switch is characterized by having resistance change characteristics shown in FIG. 1A and FIG. 1B, and by having resistance change characteristics shown in FIG. 1C and FIG. 1D.

(Bipolar Switch)

Unlike the above-mentioned unipolar switch, the bipolar switch is a switching element whose state can be switched between the OFF state and the ON state according to a polarity of the applied voltage. Here, a positive polarity is defined as a polarity in which the voltage applied to the first electrode is higher than the voltage applied to the second electrode. Further, a negative polarity is defined as a polarity in which the voltage applied to the second electrode is higher than the voltage applied to the first electrode.

The operating characteristic of the bipolar switch will be described by using FIG. 2. FIG. 2 is a figure showing the operating characteristic of the bipolar switch.

It is assumed that the bipolar switch has a structure in which the ion conductor which functions as the variable resistance layer is sandwiched between the first electrode and the second electrode. When the positive voltage is applied to the first electrode and the applied voltage value exceeds the set voltage, the state of the bipolar switch changes from the OFF state to the ON state (FIG. 2A). Hereinafter, such condition of the applied voltage is described as a forward bias.

Figure 2B:
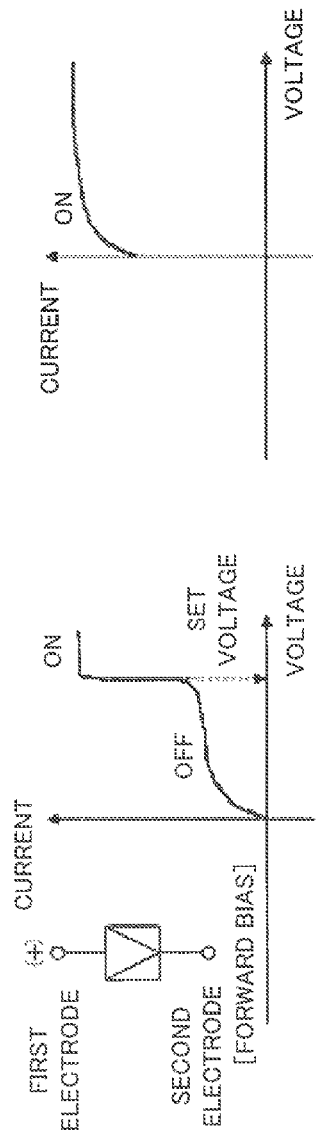

Next, when the applied voltage value is increased, the voltage-current characteristic of the bipolar switch becomes to show ohmic behavior (FIG. 2B).

Figure 2C:
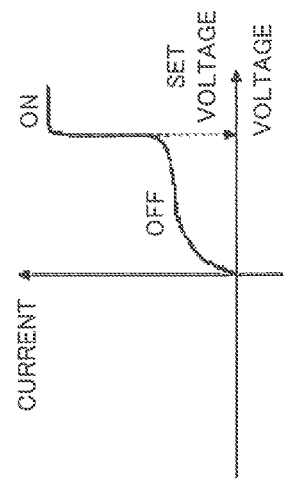

On the other hand, when the negative voltage is applied to the first electrode and the applied voltage value exceeds the reset, voltage, the state of the bipolar switch is changed from the ON state to the OFF state (FIG. 2C). Hereinafter, such condition of the applied voltage is described as a reverse bias.

Figure 2D:
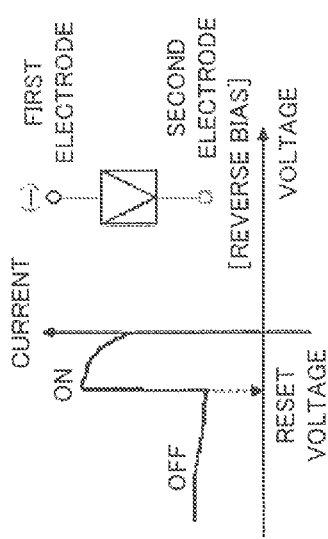

Further, the positive voltage is applied to the first electrode of the bipolar switch whose state is the OFF state again. When the positive voltage value is higher than the set voltage, the state of the bipolar switch is changed from the OFF state to the ON state (FIG. 2D). Thus, the state of the bipolar switch can be switched between the OFF state and the ON state according to the polarity of the applied voltage.

(Definition of Electrodes in Bipolar Switch)

Here, the electrode used in the bipolar switch is defined. As shown in FIG. 2A, a positive electrode is defined as an electrode to which the positive voltage is applied when the state of the bipolar switch is changed from the OFF state to the ON state. Further, a negative electrode is defined as an electrode to which the negative voltage is applied when the state of the bipolar switch is changed from the ON state to the OFF state.

Further, for convenience of explanation, it is assumed that the state of the variable resistance switch element can be switched between the OFF state and the ON state based on the applied voltage value. However, the state of the variable resistance switch element can be switched based, on another switching condition. For example, an applied current, a voltage application duration, a current application duration, or the like can be used for the switching condition. The present invention described below can be realized by the variable resistance switch element that operates based on either one of the above-mentioned switching conditions.

First Exemplary Embodiment

Figure 3:
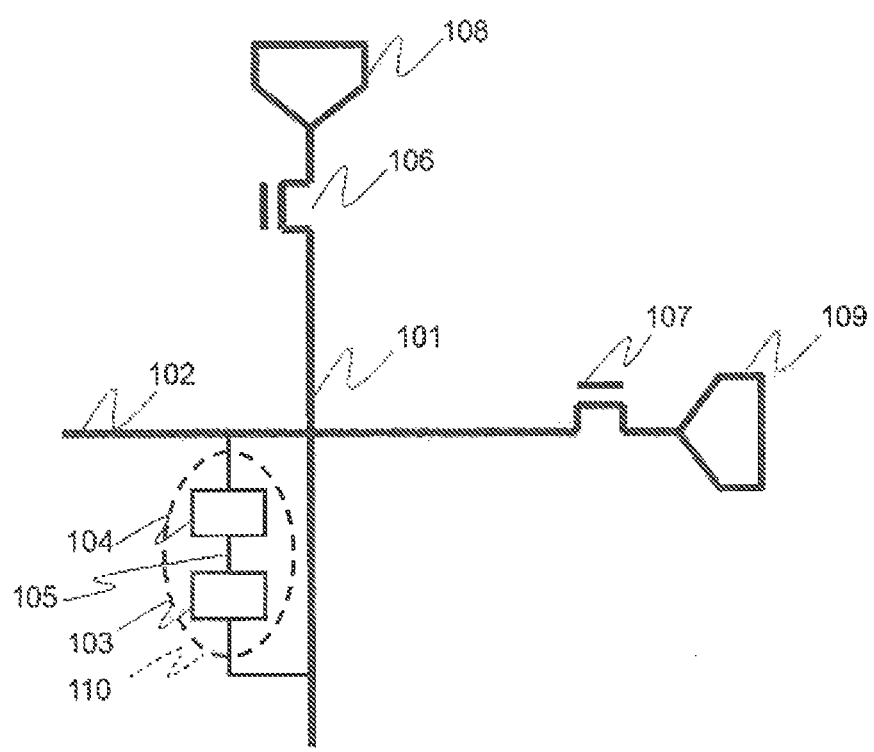
FIG. 3 is a figure snowing an example of a configuration of a semiconductor device according to a first exemplary embodiment.

A first exemplary embodiment of the present invention will be described. FIG. 3 is a figure showing an example of a configuration of a semiconductor device according to the first exemplary embodiment. The semiconductor device includes a first wiring 101, a second wiring 102, a first switch element 103, a second switch element 104, a first selection switch element 106, a second selection switch element 107, a first programming driver 108, and a second programming driver 109. The first wiring 101 and the second wiring 102 are arranged in directions that intersect with each other in a planar view for example, in directions that intersect with each other at a right angle in a planar view or the like. The first switch element 103 and the second switch element 104 are connected in series and arranged at an intersection point of the first wiring 101 and the second wiring 102. Here, one terminal of the first switch element 103 is connected to the first wiring 101. One terminal of the second switch element 104 is connected to the second wiring 102. The other terminal of the first switch element 103 and the other terminal of the second switch element 104 are connected with each other to form an intermediate node 105.

A pair of the first switch element 103 and the second switch element 104 composes one unit element 110. The first programming driver 108 is connected to the first wiring 101 via the first selection switch element 106. The second programming driver 109 is connected to the second wiring 102 via the second selection switch element 107.

Figure 4:
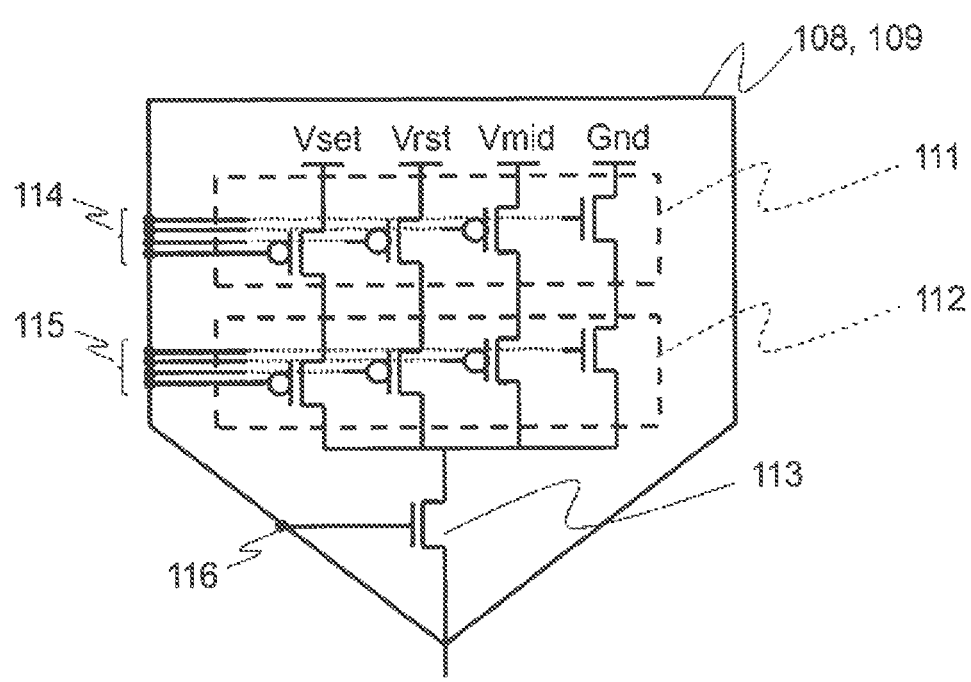
FIG. 4 is a figure showing an example of a configuration of a programming driver.

FIG. 4 shows an example of the configuration of the programming driver. The programming driver has a configuration such that a set voltage ($V_{set}$) supply state, a reset voltage ($V_{rst}$) supply state, an intermediate voltage ($V_{mid}$) supply state, a ground voltage (Gnd) supply state, or a high impedance state of the unit element can be provided, thereby changing a resistive state of the switch. Each of the power supply lines for $V_{set}$, $V_{rst}$, $V_{mid}$, and Gnd is connected to an external element (that is, the selection switch element) via constant current transistors 111, output voltage selection transistors 112, and an output transistor 113. Here, the constant current transistors ill operate as a constant-current source by controlling a gate voltage in a saturation region. The constant current transistors 111 keep the current value constant according to input signals from current control terminals 114. Each output voltage selection transistor 112 is a transistor for selecting one of $V_{set}$, $V_{rst}$, $V_{mid}$, and Gnd. Each transistor included in the output voltage selection transistors 112 is controlled by an input signal from output voltage selection terminals 115 so that the state of one transistor included in the output voltage selection transistors 112 is set to the ON state and the states of the remaining transistors are set to the OFF state. The output transistor 113 sets the states of the programming drivers 108 and 109 to a voltage output state or a high impedance state. The output transistor 113 is controlled by an input signal from an enable terminal 116.

Here, a procedure in which when the first switch element 103 and the second switch element 104 are in the OFF state, the state of the unit element 110 is changed to the ON state by using the first programming driver 108 and the second programming driver 109 will be described. First, the output voltages of the first programming driver 108 and the second programming driver 109 are set so that the output voltage of one programming driver is set to the set voltage ($V_{set}$) and the output voltage of the other programming driver is set to the ground voltage (Gnd). The states of the first selection switch element 106 and the second selection switch element 107 are set to a conduction state and the state of the unit element 110 is changed to the ON state.

A case in which the unit element 110 is composed of the unipolar switches or the bipolar switches whose polarities are the same that are connected in series is taken as an example. A relationship between an element set voltage ($V_{set\_device}$) of the first switch element 103 and the second switch element 104 and the set voltage ($V_{set\_unit}$) of the unit element 110 is expressed by the following equation.

[Math. 1]

$$V_{set\_device} < V_{set\_unit} < 2 \times V_{set\_device} \qquad \text{(Equation 1)}$$

When the characteristic of the first switch element 103 is completely equal to that of the second switch element 104, the set voltage is divided into two equal voltages. Therefore, the set voltage ($V_{set\_unit}$) is equal to two times of the element set voltage ($V_{set\_device}$). However, when there is a characteristic difference between two switch elements and the element set voltages of two switch elements are not equal to each other, the set voltage ($V_{set\_unit}$) is in a range expressed by the above-mentioned Equation 1. Anyway, in this example, the electric potential difference ($V_{set}$) supplied by the first programming driver 108 and the second programming driver 109 has to be higher than the voltage ($V_{set\_device}$).

Next, OFF reliability will be considered. When the first switch element 103 and the second switch element 104 are regarded as one unit element 110, two switches are connected in series between the first wiring 101 and the second wiring 102. By this configuration, the semiconductor device of the exemplary embodiment can realize high OFF reliability. Namely, when two elements are in the OFF state, the electric potential difference between the first wiring 101 and the second wiring 102 is divided into two voltages by two elements. Therefore, high OFF reliability can be realized in comparison with a case in which only one switch element is arranged.

As described above, by using this exemplary embodiment, it is possible to provide the semiconductor device which can realize high OFF reliability in comparison with a case in which only one switch element is arranged, and thereby realizing high reliability.

Second Exemplary Embodiment

Figure 5:
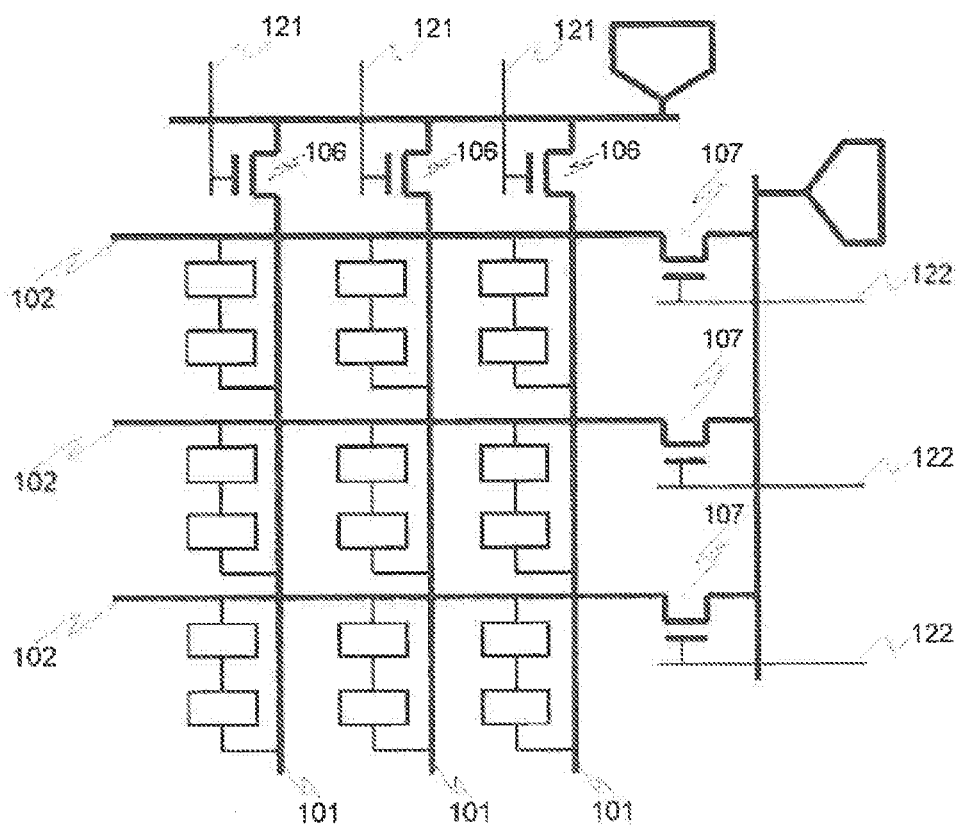
FIG. 5 is s figure showing an example of a configuration of a semiconductor device according to a second exemplary embodiment.

As shown in FIG. 5, this exemplary embodiment discloses a structure in which a plurality of the unit elements 110 disclosed in the first exemplary embodiment are arranged in an array shape. Although not clearly specified in the first exemplary embodiment, in this exemplary embodiment, first decode signal lines 121 and second decode signal lines 122 are provided. In order to program the arbitrary unit element 110, the first decode signal line 121 and the second decode signal line 122 control a conduction/non-conduction state of the first selection switch element 106 and the second selection switch element 107. The first decode signal line 121 and the first wiring 101 are arranged in parallel and the second decode signal line 122 and the second wiring 102 are arranged in parallel. A plurality of the first selection switch elements 106 are commonly connected to the first programming driver 108. A plurality of the second selection switch elements 107 are commonly connected to the second programming driver 109.

Here, a procedure in which when all the unit elements 110 arranged in an array shape are in the OFF state, the state of the desired unit element 110 is changed to the ON state will be described. A setting is performed so that the first programming driver 108 and the second programming driver 109 output the intermediate voltage ($V_{mid}$). At this time, it is preferable to set $V_{mid}$ to an intermediate voltage between Gnd and $V_{set}$. The reason is as follows. Each unit element 110 that is not a programming target is disconnected when the unit element 110 that is a programming target is programmed and the state of the unit element 110 that is not a programming target will be in a floating state. The electric potentials of the both ends of each unit element 110 that is in the floating state depend on the electric potentials of the first wiring 101 and the second wiring 102 just before the disconnection of the unit element 110. Here, as mentioned above, when the electric potential is not adjusted, there is a possibility that the voltages $V_{set}$ and Gnd remain on the first wiring 101 and the second wiring 102 that are connected to the unit element 110 that was the programming target in the last stage even when the unit element 110 is disconnected. When an electric potential approximately equal to the voltage Gnd remains on the second wiring 102 connected to the unit element 110 that was the programming target in the last stage, erroneous writing may be performed to the unit element 110 that is arranged at the intersection point of this second wiring 102 and the first wiring 101 connected to the unit element 110 that is the programming target in this time and not the programming target. Therefore, it is desirable to adjust the electric potentials of the both ends of each unit element 110. When this electric potential is equal to $V_{set}/2$, the erroneous writing can be greatly prevented.

Next, by using all the first decode signal lines 121, the states of all the first selection switch elements 106 are set to the conduction state and whereby, all the first wirings 101 are charged to $V_{mid}$. Further, by using all the second decode signal lines 122, the states of all the second selection switch elements 107 are set to the conduction state and whereby, all the second wirings 102 are charged to $V_{mid}$. Next, by using all the first decode signal lines 121, the states of all the first selection switch elements 106 are set to the non-conduction state and whereby, all the first wirings 101 are disconnected from the first programming driver 108. Further, by using all the second decode signal lines 122, the states of all the second selection switch elements 107 are set to the non-conduction state and whereby, all the second wirings 102 are disconnected from the second programming driver 109. Next, the output voltages of the first programming driver 108 and the second programming driver 109 are set so that the output voltage of one programming driver is set to $V_{set}$ and the output voltage of the other programming driver is set to Gnd. Next, in order to select the unit element 110 that is the programming target, the state of only the corresponding selection switch element is set to the conduction state and the states of the other selection switch elements are set to the non-conduction state by using the respective decode signal line. By the above-mentioned procedure, the state of only the selected unit element 110 is set to the ON state. For example, in FIG. 5, when the state of only the unit element 110 shown in the upper left part of FIG. 5 is set to the ON state, the state of the first selection switch element 106 connected to the leftmost first decode signal line 121 and the state of the second selection switch element 107 connected to the uppermost second decode signal line 122 may be set to the conduction state.

Figure 6:
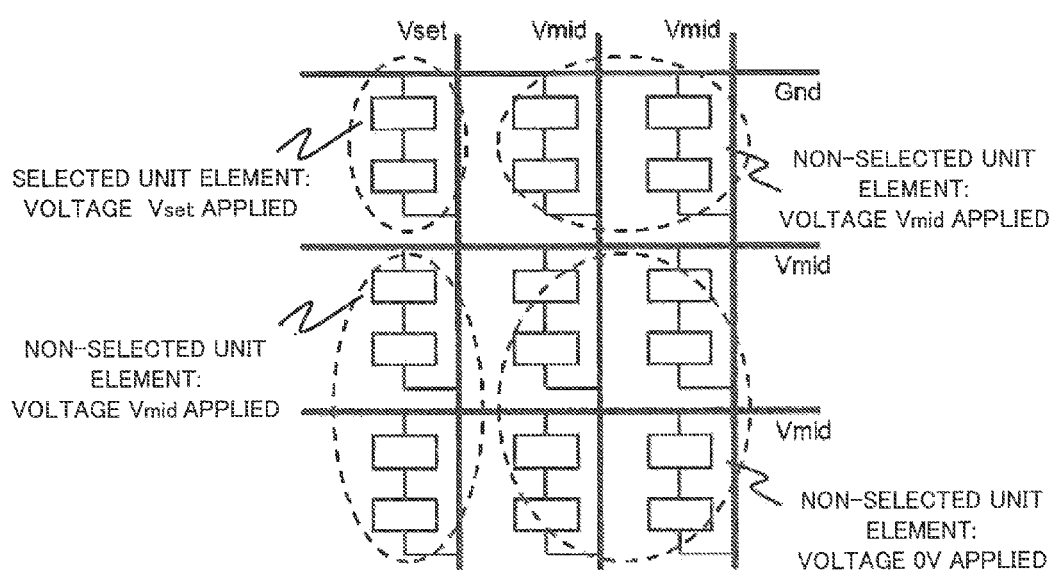
FIG. 6 is a figure illustrating a voltage of each node in a 3×3 array configuration when programming is performed.

The voltage of each node in a 3×3 array configuration at the time of programming will be described by using FIG. 6. First, with respect to the first wiring 101 and the second wiring 102 that supply the voltage to the unit element 110 that is the programming target, $V_{set}$ is applied to the first wiring 101, and Gnd is applied to the second wiring 102. With respect to the first wiring 101 and the second wiring 102 that supply the voltage to the non-selected node that is not the programming target, $V_{mid}$ is applied to the non-selected node. In this case, as illustrated in FIG. 6, $V_{set}$ is applied to the selected unit element 110, $V_{mid}$ or 0 V is applied to the non-selected unit element 110. Here, in order to prevent the non-selected unit element 110 from being erroneously programmed, it is desirable that $V_{mid}$ is set to be equal to $½V_{set}$. When a characteristic difference between the first switch element 103 and the second switch element 104 of which the unit element 110 is composed is negligible small, the voltages are set so as to satisfy a relation of "$V_{set}=V_{set\_unit}=2\times V_{set\_device}$". In this case, a relation of "$V_{mid}=½V_{set\_unit}=V_{set\_device}$" is satisfied. When the characteristic difference between the elements is taken into consideration, there is a possibility that erroneous writing occurs even when the relation of "$V_{mid}=V_{set\_device}$" is satisfied from Equation 1. Therefore, it is desirable that the characteristics of the first switch element 103 and the second switch element 104 are as equal as possible to each other.

As described above, the second exemplary embodiment has the same effect as the first exemplary embodiment.

Further, in this exemplary embodiment, a configuration in which the electric potentials of the both ends of each unit element 110 are adjusted before programming is performed is used. By using this configuration, the unit element 110 that is not the programming target can be prevented from being erroneously programmed.

Third Exemplary Embodiment

In this exemplary embodiment, the intermediate node 105 of the unit element 110 is used for the programming of the unit element 110 and whereby, this exemplary embodiment further has an effect in which the voltage $V_{set}$ can be reduced and a possibility of the erroneous writing can be reduced.

Figure 7:
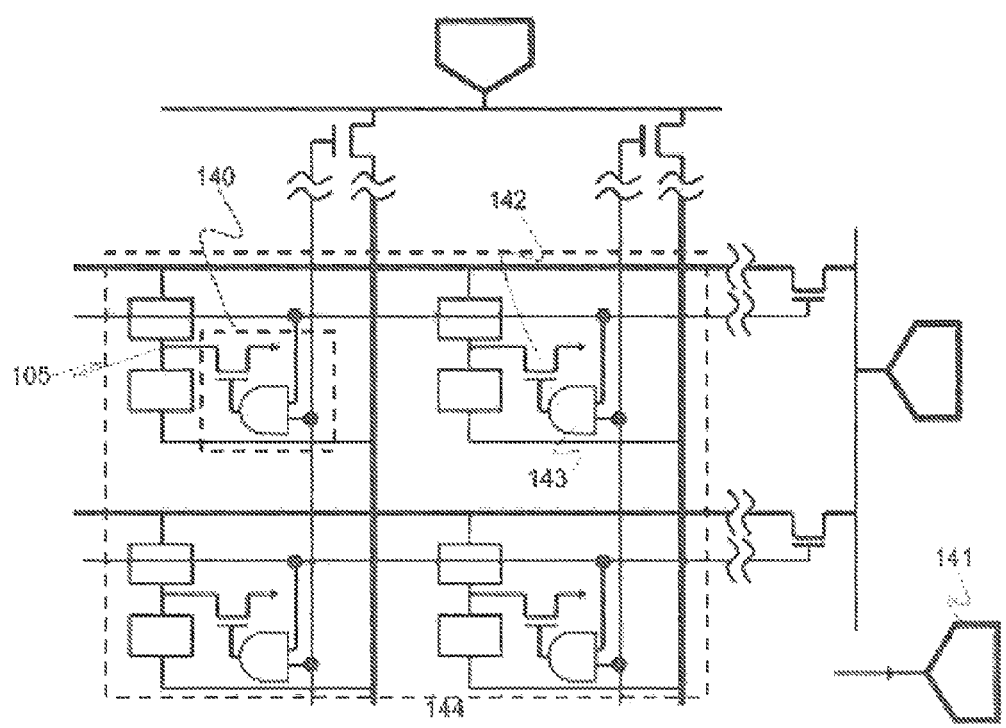
FIG. 7 is a figure showing an example of a configuration of a semiconductor device according to a third exemplary embodiment.

FIG. 7 shows an example of a configuration of a semiconductor device according to a third exemplary embodiment. This exemplary embodiment discloses a mode in which an intermediate node programming driver 141 is connected to the intermediate node 105 of the unit element 110 via an intermediate node selection circuit 140. Further, the description of the element explained in the exemplary embodiments 1 and 2 will be omitted.

In FIG. 7, the intermediate node selection circuit 140 is composed of an intermediate node selection switch element 142 and a decode circuit 143. The intermediate node selection switch element 142 changes a state of a connection between the intermediate node 105 and the intermediate node programming driver 141 based on the output signal from the decode circuit 143. The input signal of the decode circuit 143 is the first decode signal line 121 and the second decode signal line 122. Accordingly, the first decode signal line 121 and the second decode signal line 122 are connected to the first selection switch element 106 and the second selection switch element 107, respectively and extended to the inside of an array unit 144. The output circuit of the decode circuit 143 is connected to a gate terminal of the intermediate node selection switch element 142. A plurality of the intermediate node selection switch elements 142 are commonly connected to the intermediate node programming driver 141. In this example, the first selection switch element 106, the second selection switch element 107, and the intermediate node selection switch element 142 are n-type FETs (Field Effect Transistors) and the decode circuit 143 is an AND circuit with two inputs. When such configuration is used, an intersection part of the array at which the first decode signal line 121 whose level is "high" intersects with the second decode signal line 122 whose level is "high" is selected and the unit element 110 located at the address is connected to the programming driver uniquely. When the logic of the selection is inverted, a p-type FET may be used for the selection transistor and an OR circuit with two inputs may be used for the decode circuit 143. Further, an NAND circuit or an NOR circuit can be used for the decode circuit 143.

In this exemplary embodiment, a procedure in which when all the unit elements 110 arranged in an array shape are in the OFF state, the state of the desired unit element 110 is changed to the ON state will be described.

First, a setting is performed so that the first programming driver 108, the second programming driver 109, and the intermediate node programming driver 141 output $V_{mid}$. Next, the states of all the first selection switch elements 106 are set to the conduction state by using all the first decode signal lines 121 and whereby, all the first wirings 101 are charged to $V_{mid}$. Further, the states of all the second selection switch elements 107 are set to the conduction state by using all the second decode signal lines 122 and whereby, all the second wirings 102 are charged to $V_{mid}$. Further, the states of all the intermediate node selection switch elements 142 are set to the conduction state by using all the first decode signal lines 121 and all the second decode signal lines 122 and whereby, all the intermediate nodes 105 are charged to $V_{mid}$. After this process, the states of all the first selection switch elements 106, all the second selection switch elements 107, and all the intermediate node selection switch elements 142 are set to the non-conduction state. The output voltage of the first programming driver 108 is set to $V_{set}$, the output voltage of the intermediate node programming driver 141 is set to Gnd, and the state of the second programming driver 109 is set to a high impedance state. After this process, a selection level (in this example, High level) is applied to the first decode signal line 121 and the second decode signal line 122 according to the unit element 110 that is the programming target and whereby, the state of the intermediate node selection transistor (intermediate node selection switch element) 142 connected to the unit element 110 that is the programming target is set to the conduction state. As a result, the voltage $V_{set}$ is applied to the first switch element 103. By the above-mentioned procedure, the state of the first switch element 103 of the unit element 110 that is the programming target can be changed to the ON state.

Here, because the state of the decode circuit 143 is not changed to the selection state (in this example, the AND circuit does not output High level), the intermediate node selection switch element 142 is maintained in the non-conduction state. Therefore, the non-selected unit element 110 is not programmed because the voltage is not applied. Further, because the second programming driver 109 is in the high impedance state, the second switch element 104 of the unit element 110 that is the programming target is not programmed.

Next, the second switch element 104 is programmed by using the same procedure. Namely, the states of all the first selection switch elements 106, all the second selection switch elements 107, and all the intermediate node selection switch elements 142 are set to bring back to the non-conduction state again. The output voltages of the first programming driver 108, the second programming driver 109, and the intermediate node programming driver 141 are set bring back to the voltage $V_{mid}$ again. After this process, the states of all the first selection switch elements 106, all the second selection switch elements 107, and all the intermediate node selection switch elements 142 are set to the conduction state and whereby, all the first wirings 101, all the second wirings 102, and all the intermediate nodes 105 are charged to $V_{mid}$. After this process, the state of the first programming driver 108 is set to the high impedance state, the output voltage of the intermediate node selection transistor 142 is set to Gnd, and the output voltage of the second programming driver 109 is set to $V_{set}$. After this process, the selection level (in this example. High level) is applied to the first decode signal line 121 and the second decode signal line 122 according to the unit element 110 that is the programming target and whereby, the state of the selection transistor connected to the unit element 110 that is the programming target is set to the conduction state. As a result, the voltage $V_{set}$ is applied to the second switch element 104. By the above-mentioned procedure, the state of the second switch element 104 of the unit element 110 that is the programming target can be changed to the ON state.

By the above-mentioned procedure, because the states of both the first switch element 103 and the second switch element 104 in the unit element 110 that is the programming target are set to the ON state, the state of the unit element 110 that is the programming target is set to the ON state. As a result, the unit element 110 that is the programming target can be programmed.

As described above, in this exemplary embodiment, in order to separately program the switch elements of which the unit element 110 is composed, $V_{set\_device}$ that is the set voltage of the switch element is applied as $V_{set}$. Therefore, the set voltage can be reduced because in the exemplary embodiments 1 and 2, the voltage of $2 \times V_{set\_device}$ (maximum) has to be applied as the set voltage $V_{set}$. Accordingly, by using this exemplary embodiment, the semiconductor device which can realize compatibility between high-reliability and low-voltage operation can be provided.

Further, because the switch elements can be individually programmed, the first switch element 103 and the second switch element 104 can be realized by using the unipolar switch, the bipolar switch, or the combination of them. Further, the first switch element 103 and the second switch element 104 may be connected to each other in the same polarity or reverse polarity of the bipolar switch. Therefore, the present invention has an advantage in which the unit element can be flexibly configured independently of the characteristic of the switch element.

Figure 8:
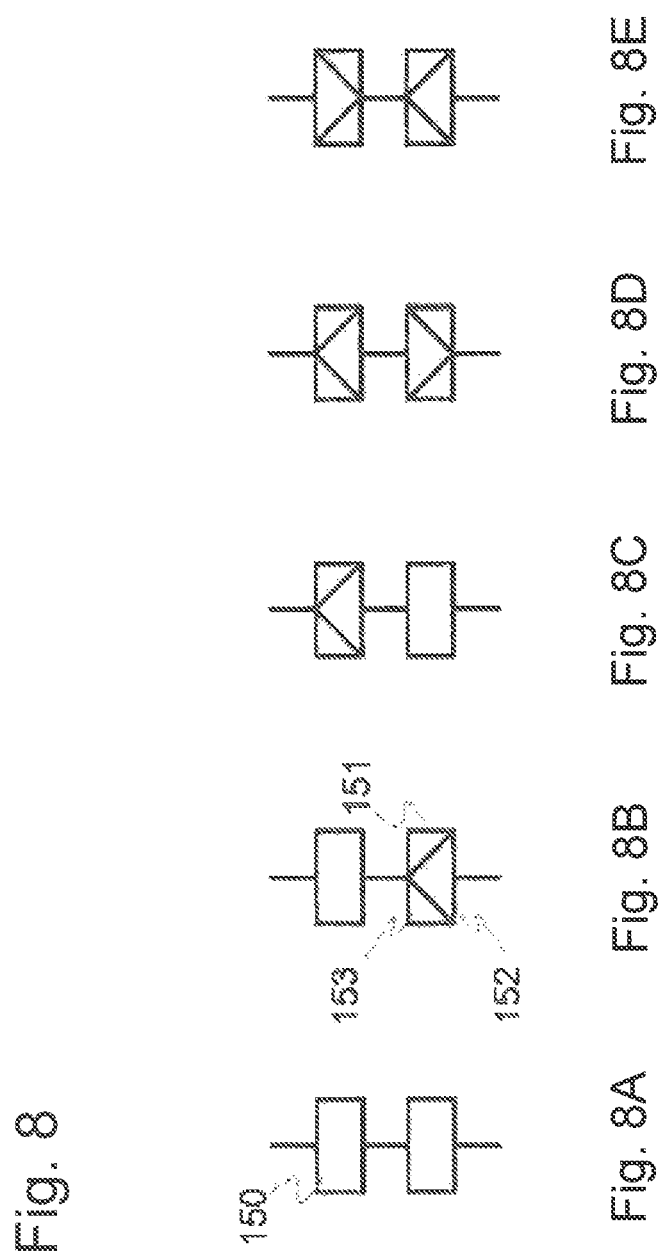
FIGS. 8A, 8B, 8C, 8D, and 8E are figures showing an example of a combination of switch elements of which a unit element is composed.

Here, FIG. 8 shows an example of the combination of the switch elements of which the unit element 110 is composed in order to improve the OFF reliability of the unit element 110, it is further desirable for the unit element to use an example in which the bipolar switches are connected with each other in reverse polarity (FIGS. 8D and 8E). Namely, in the unit element 110 shown in FIGS. 8D and 8E, when the voltage to set the state of one switch element to the ON state is applied, this applied voltage acts so that the state of the other switch element is set to the OFF state. Therefore, there is an effect in which the unit element 110 can be prevented from being erroneously programmed.

Fourth Exemplary Embodiment

Figure 9:
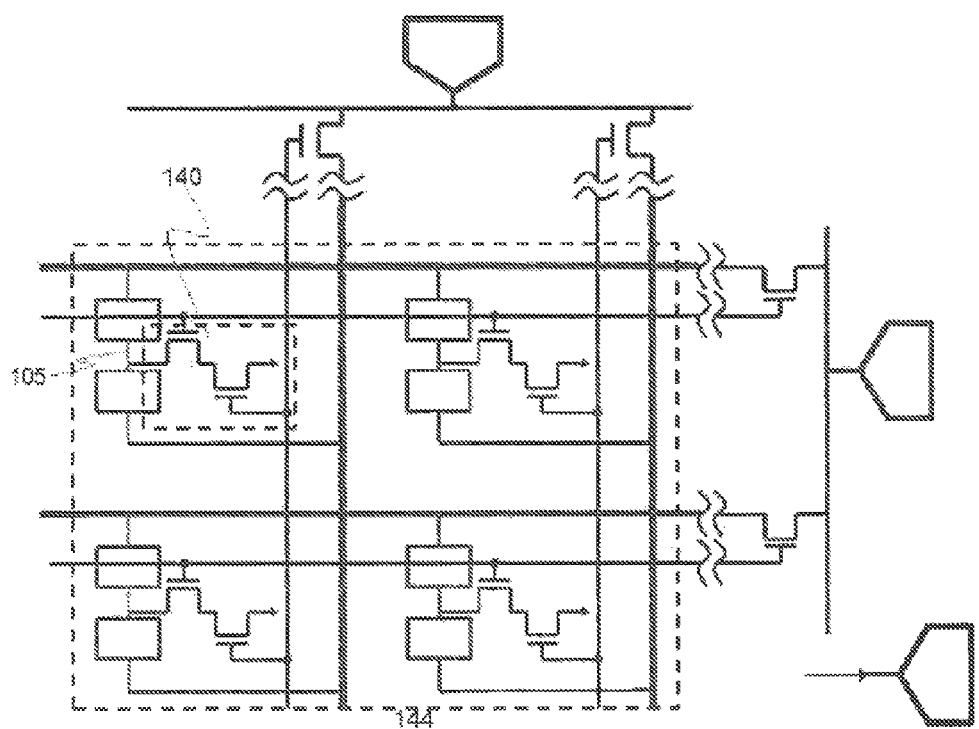
FIG. 9 is a figure showing an example of a configuration of a semiconductor device according to a fourth exemplary embodiment.

This exemplary embodiment discloses a mode in which the number of the transistors included in the intermediate node selection circuit 140 of the third exemplary embodiment can be reduced. FIG. 9 is a figure showing an example of a configuration of a semiconductor device according to a fourth exemplary embodiment.

In this exemplary embodiment, as shown in FIG. 9, the intermediate node selection circuit 140 is composed of two transistors. These transistors act as both the decode circuit 143 and the intermediate node selection transistor 142 of the third exemplary embodiment. In this example, the first selection switch element 106 and the second selection switch element 107 are ii-type FETs, and the intermediate node selection switch element 142 is composed of two n-type FETs connected in series.

The gate terminal of one of two FETs of which the intermediate node selection switch element 142 is composed is connected to the first programming driver 108 via the first decode signal line 121 and the gate terminal of the other FET is connected to the second programming driver 109 via the second decode signal line 122. When such configuration is used, the intersection part of the array at which the first decode signal line 121 whose level is "High" intersects with the second decode signal line 122 whose level is "High" is selected and the unit element 110 located at the address is connected to the programming driver uniquely. When the logic of the selection is inverted, all the transistors of which the selection switch element is composed may be the p-type FETs.

In the third exemplary embodiment, when the intermediate node selection switch element 142 is configured by the n-type FET and the decode circuit 143 is configured by the NAND circuit with two inputs, the number of transistors of which the intermediate node selection circuit 140 is composed is five (minimum). On the other hand, in this exemplary embodiment, two transistors are enough to configure the intermediate node selection circuit 140. Therefore, the intermediate node selection circuit 140 can be configured by a simple circuit.

Fifth Exemplary Embodiment

Figure 10:
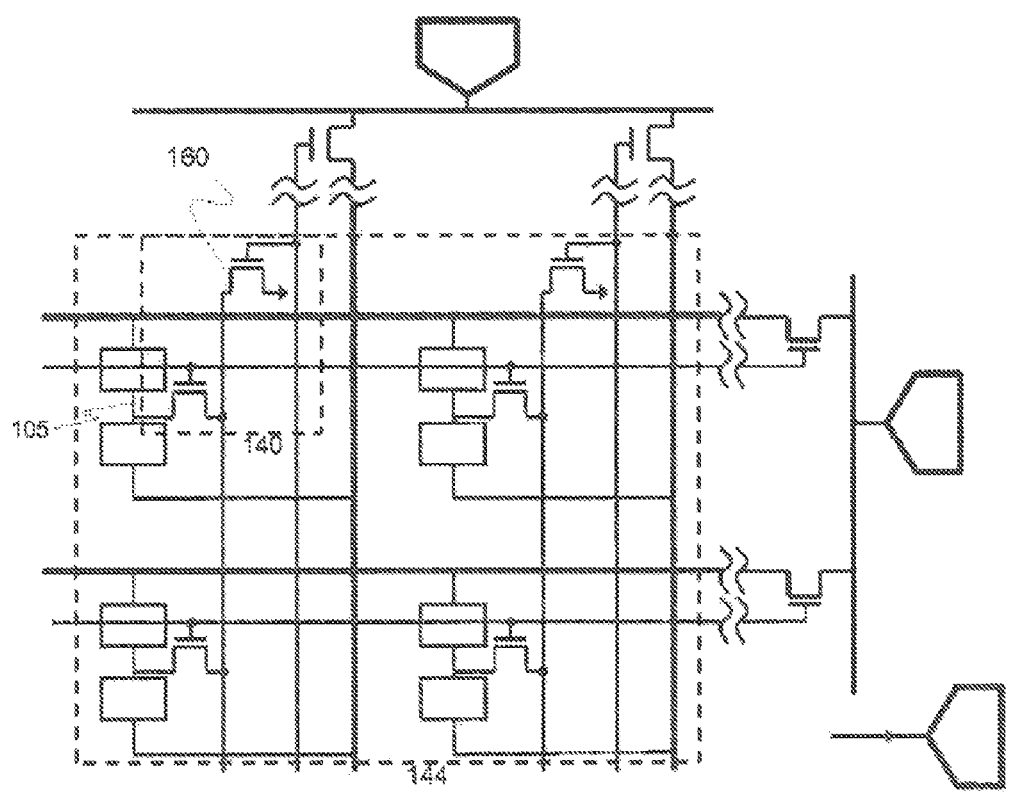
FIG. 10 is a figure showing an example of a configuration of a semiconductor device according to a fifth exemplary embodiment.

This exemplary embodiment discloses a mode in which the number of the transistors of the intermediate node selection circuit 140 of the fourth exemplary embodiment can be further reduced. Because the same decode signal line is used for a plurality of the intermediate node selection circuits 140, the transistors, each of which is arranged to an intermediate node programming driver 141 side in two transistors of which the intermediate node selection circuit 140 is composed, can be integrated into one transistor. FIG. 10 is a figure showing an example of a configuration of a semiconductor device according to the fifth exemplary embodiment. Referring to FIG. 10, the transistors, each of which is one of the transistors of which the intermediate node selection circuit 140 is composed, which use the same first decode signal line 121 are integrated and arranged as a common use-type intermediate node selection switch element 160. Thus, simplification of the circuit does not affect the selection logic by the decode signal and the number of the transistors included in the intermediate node selection circuit 140 can be reduced nearly to one.

Further, in the exemplary embodiment mentioned above, the explanation has been provided by using the 3×3 array configuration in maximum. However, it goes without saying that the above-mentioned exemplary embodiment can be easily expanded to an m×n array configuration. Further, in the fifth exemplary embodiment, when m<n, it is more desirable to simplify the circuit of an n column side of the array in order to reduce the number of transistors from a standpoint of the area efficiency.

Example

Figure 11:
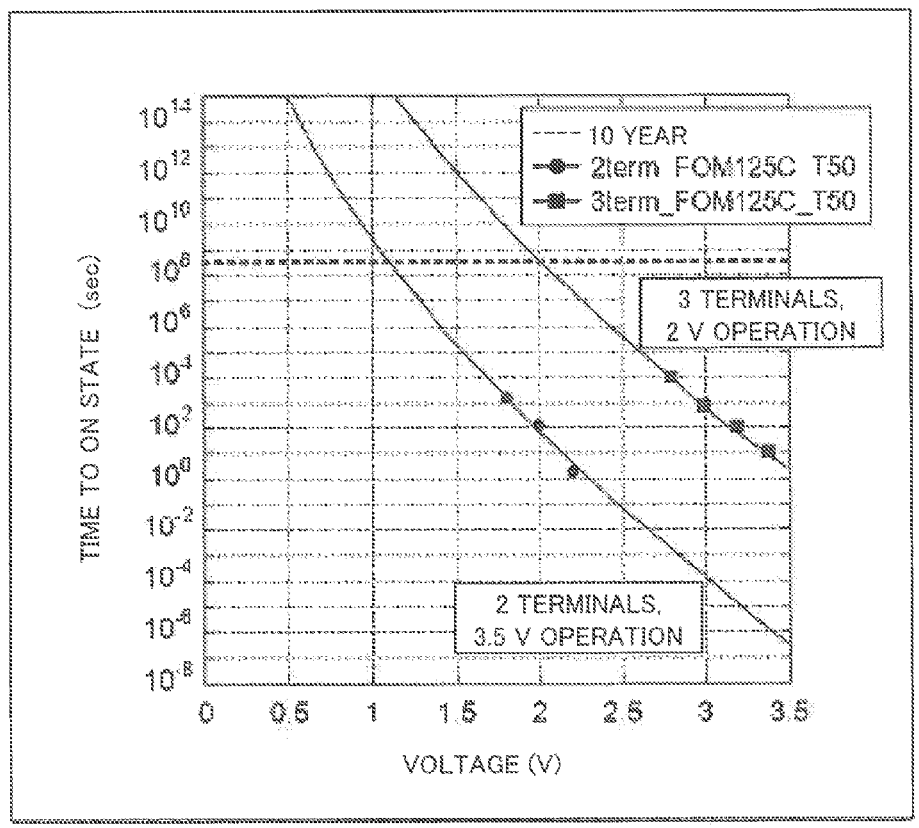
FIG. 11 is a figure showing a comparison between operating characteristic of a semiconductor device using a conventional two terminal type switch element and operating characteristic of a semiconductor device according to an example.

FIG. 11 is a figure showing a comparison between operating characteristic of the semiconductor device using a conventional two terminal type switch element (that corresponds to the unit element composed of only either the first switch or the second switch in the exemplary embodiment) and operating characteristic of a semiconductor device according to this example.

In FIG. 11, when comparing the operating characteristic of the semiconductor device using the two terminal type switch element with the operating characteristic of the semiconductor device according to this example, it is understood that by using the semiconductor device according to this example, predicted lifetime increases from ten years to one million years when the applied voltage is one volt.

Accordingly, by using the present invention, the semiconductor device which can realize high reliability and low-voltage operation can be provided. Although the present invention has been described above with reference to some preferred exemplary embodiments and the example, these exemplary embodiments and the example do not limit the invention and the invention is not limited to these exemplary embodiments and the example.

In the above-mentioned description, the semiconductor device including the unit element 110 having the function of switching between the first wiring 101 and the second wiring 102 has been described. However, the application of the present invention is not limited to such semiconductor device. For example, the present invention can be applied to a semiconductor device including a memory circuit such as a DRAM (Dynamic Random Access Memory), an SRAM (Static Random Access Memory), a flash memory, an FRAM (Ferro Electric Random Access Memory: registered trademark), an MRAM (Magnetic Random Access Memory), a bipolar transistor, or the like, a semiconductor device including a logic circuit such as a microprocessor or the like, or a wiring of a board, a package, or the like that mounts the above-mentioned components.

Further, the unit element 110 according to the present invention can be applied to a switching of an electronic circuit device used to the semiconductor device, an optical circuit device, a quantum circuit device, a micro-machine, a MEMS (Micro Electro Mechanical Systems), or the like. Further, in the present invention, the switch function has been mainly explained with reference to the example. However, the present invention can be used for a memory element using non volatility and variable resistance characteristic.

It is clear that it is easy for the person skilled in the art to make a lot of modifications or replacements by using equivalent configuration element or technology after the person skilled in the art reads the specification and it is clear that such modifications or replacements are included in the true scope and spirit of the attached claim.

Further, according to the exemplary embodiments mentioned above, the following invention is disclosed.

(Supplementary Note 1)

A semiconductor device including a variable resistance first switch which includes a first terminal and a second terminal and whose resistive state changes when a predetermined condition is satisfied after electric power is applied, a variable resistance second switch which includes a third terminal and a fourth terminal and configures an intermediate node by connecting the third terminal and the second terminal, and whose resistive state changes when a predetermined condition is satisfied after electric power is applied, a first wiring which is connected to the first terminal, a second wiring which is connected to the fourth terminal and extends in a direction intersecting with the first wiring in a planar view, a first selection switch element which is connected to the first wiring, and a second selection switch element which is connected to the second wiring.

(Supplementary Note 2)

The semiconductor device described in Supplementary note 1 wherein at least either a set of the first wiring, the first selection switch element, and a first decode signal line connected to the first selection switch element or a set of the second wiring, the second selection switch element, and a second decode signal line connected to the second selection switch element is plurally provided and an array unit in which a plurality of unit elements, each of which is composed of the first switch and the second switch, are arranged at intersections of the first wiring and the second wiring in a matrix shape is included.

(Supplementary Note 3)

The semiconductor device described in Supplementary note 2 wherein the semiconductor device further includes a first programming driver connected to the first wiring via the first selection switch element and a second programming driver connected to the second wiring via the second selection switch element and the semiconductor device has at least either a configuration in which the first programming driver is connected to a plurality of the first selection switch elements or a configuration in which the second programming driver is connected to a plurality of the second selection switch elements.

(Supplementary Note 4)

The semiconductor device described in any one of Supplementary notes 1 to 3 wherein an intermediate node selection circuit which changes a state of connection between an intermediate node control signal line that transmits a signal for controlling a voltage or a current of the intermediate node and the intermediate node is further provided for each intermediate node and the intermediate node selection circuit changes the state of the connection between the intermediate node control signal line and the intermediate node based on a signal from the first decode signal line connected to the first selection switch element and a signal from the second decode signal line connected to the second selection switch element.

(Supplementary Note 5)

The semiconductor device described in Supplementary note 4 wherein the semiconductor device has a configuration in which at least either a set of the first wiring, the first selection switch element, and the first decode signal line connected to the first selection switch element or a set of the second wiring, the second selection switch element, and the second decode signal line connected to the second selection switch element is plurally provided, an intermediate node programming driver connected to the intermediate node via the intermediate node selection circuit is further provided, and the intermediate node programming driver is connected to a plurality of the intermediate node selection circuits.

(Supplementary Note 6)

The semiconductor device described in Supplementary note 4 or Supplementary note 5 wherein the intermediate node selection circuit includes a decode circuit which is one of an AND circuit, an OR circuit, an NAND circuit, and an NOR circuit and receives the signal from the first decode signal line and the signal from the second decode signal line as an input signal and an intermediate node selection switch element which changes the state of the connection between the intermediate node control signal line and the intermediate node by the output signal of the decode circuit.

(Supplementary Note 7)

The semiconductor device described in Supplementary note 4 or Supplementary note 5 wherein the first selection switch element and the second selection switch element are transistors, the intermediate node selection circuit includes a first intermediate node selection transistor and a second intermediate node selection transistor which have the same type of channel as the first selection switch element and the second selection switch element, the first intermediate node selection transistor includes a fifth terminal, a sixth terminal, and a first gate terminal, the second intermediate node selection transistor includes a seventh terminal, an eighth terminal, and a second gate terminal, the fifth terminal is connected to the intermediate node control signal line, the sixth terminal and the seventh terminal are connected to each other, the eighth terminal is connected to the intermediate node, and one of the first gate terminal and the second gate terminal is connected to the first decode signal line and the other is connected to the second decode signal line.

(Supplementary Note 8)

The semiconductor device described in Supplementary note 7 wherein at least either a set of the first wiring, the first selection switch element, and the first decode signal line or a set of the second wiring, the second selection switch element, and the second decode signal line is plurally provided, an array unit in which a plurality of unit elements, each of which is composed of the first switch and the second switch, are arranged at intersections of the first wiring and the second wiring in a matrix shape is included, the second intermediate node selection transistor is provided in each of a plurality of the intermediate node selection circuits, and the first intermediate node selection transistor of one intermediate node selection circuit further operates as the first intermediate node selection transistor of at least one of the other intermediate node selection circuits and the first intermediate node selection transistor is connected to the second intermediate node selection transistor of the other intermediate node selection circuit.

(Supplementary Note 9)

The semiconductor device described in any one of Supplementary notes 1 to 8 wherein the first switch and the second switch are bipolarity type variable resistance elements and an intermediate node is configured by connecting the terminals of the unit elements, each of which is composed of the first switch and the second switch, whose polarities are the same as each other.

(Supplementary Note 10)

A programming method comprising:

preparing a semiconductor device includes a variable resistance first switch which has a first terminal and a second terminal and whose resistive state changes when a predetermined condition is satisfied after electric power is applied, and a variable resistance second switch which has a third terminal and a fourth terminal and configures an intermediate node by connecting the third terminal and the second terminal, and whose resistive state changes when a predetermined condition is satisfied after electric power is applied; and wherein the semiconductor device programs a unit element composed of the first switch and the second switch by applying a voltage or a current between the first terminal and the fourth terminal so that the first switch and the second switch satisfy the condition and by changing the resistive states of the first switch and the second switch.

(Supplementary Note 11)

The programming method described in Supplementary note 10 wherein in the semiconductor device, at least either a set of the first wiring, the first selection switch element, and a first decode signal line connected to the first selection switch element or a set of the second wiring, the second selection switch element, and a second decode signal line connected to the second selection switch element is plurally provided, an array unit in which a plurality of unit elements, each of which is composed of the first switch and the second switch, are arranged at intersections of the first wiring and the second wiring in a matrix shape is included, and the unit element that is a programming target is uniquely selected by performing switching between a signal from the first decode signal line and a signal from the second decode signal line.

(Supplementary Note 12)

The programming method described in Supplementary note 11 wherein the semiconductor device further includes a first programming driver connected to the first wiring via the first selection switch element and a second programming driver connected to the second wiring via the second selection switch element, has at least either a configuration in which the first programming driver is connected to a plurality of the first selection switch elements or a configuration in which the second programming driver is connected to a plurality of the second selection switch elements, and controls a voltage or a current applied to the unit element based on a signal from the first programming driver and a signal from the second programming driver.

(Supplementary Note 13)

The programming method described in any one of Supplementary notes 10 to 12 wherein the semiconductor device further includes an intermediate node selection circuit which changes a state of connection between an intermediate node control signal line that transmits a signal for controlling a voltage or a current of the intermediate node and the intermediate node for each intermediate node and the intermediate node selection circuit changes the state of the connection between the intermediate node control signal line and the intermediate node based on a signal from the first decode signal line connected to the first selection switch element and a signal from the second decode signal line connected to the second selection switch element and changes a resistive state of the first switch and a resistive state of the second switch individually.

(Supplementary Note 14)

The programming method described in Supplementary note 13 wherein the semiconductor device has a configuration in which at least either a set of the first wiring, the first selection switch element, and the first decode signal line connected to the first selection switch element or a set of the second wiring, the second selection switch element, and the second decode signal line connected to the second selection switch element is plurally provided, an intermediate node programming driver connected to the intermediate node via the intermediate node selection circuit is further included, and the intermediate node programming driver is connected to a plurality of the intermediate node selection circuits, and the intermediate node selection circuit controls the voltage or the current applied to the first switch based on the signal from the first programming driver and the signal from the intermediate node programming driver and controls the voltage or the current applied to the second switch based on the signal from the second programming driver and the signal from the intermediate node programming driver.

(Supplementary Note 15)

The programming method described in Supplementary note 13 or Supplementary note 14 wherein
the intermediate node selection circuit includes
a decode circuit which is one of an AND circuit, an OR circuit, an NAND circuit, and an NOR circuit and receives the signal from the first decode signal line and the signal from the second decode signal line as an input signal and
an intermediate node selection switch element which changes the state of the connection between the intermediate node control signal line and the intermediate node by the output signal of the decode circuit.

(Supplementary Note 16)

The programming method described in Supplementary note 13 or Supplementary note 14 wherein
the first selection switch element and the second selection switch element are transistors,
the intermediate node selection circuit includes a first intermediate node selection transistor and a second intermediate node selection transistor which have the same type of channel as the first selection switch element and the second selection switch element,
the first intermediate node selection transistor includes a fifth terminal, a sixth terminal, and a first gate terminal,
the second intermediate node selection transistor includes a seventh terminal, an eighth terminal, and a second gate terminal,
the fifth terminal is connected to the intermediate node control signal line,
the sixth terminal and the seventh terminal are connected to each other,
the eighth terminal is connected to the intermediate node, and
one of the first gate terminal and the second gate terminal is connected to the first decode signal line and the other is connected to the second decode signal line, and
the first intermediate node selection transistor and the second intermediate node selection transistor change the state of the connection between the intermediate node control signal line and the intermediate node based on the signal from the first decode signal line and the signal from the second decode signal line.

(Supplementary Note 17)

The programming method described in Supplementary note 16 wherein
the semiconductor device has a configuration in which
at least either a set of the first wiring, the first selection switch element, and the first decode signal line or a set of the second wiring, the second selection switch element, and the second decode signal line is plurally provided,
an array unit in which a plurality of unit elements, each of which is composed of the first switch and the second switch, are arranged at intersections of the first wiring and the second wiring in a matrix shape is included,
the second intermediate node selection transistor is provided in each of a plurality of the intermediate node selection circuits, and
the first intermediate node selection transistor of one intermediate node selection circuit further operates as the first intermediate node selection transistor of at least one of the other intermediate node selection circuits and the first intermediate node selection transistor is connected to the second intermediate node selection transistor of the other intermediate node selection circuit.

(Supplementary Note 18)

The programming method described in any one of Supplementary notes 10 to 17 wherein
the first switch and the second switch are bipolarity type variable resistance elements and
the intermediate node is configured by connecting the terminals of the unit elements, each of which is composed of the first switch and the second switch, whose polarities are the same as each other.

This application claims priority based on Japanese Patent Application No. 2012-139062 filed on Jun. 20, 2012, the disclosure of which is hereby incorporated by reference in its entirety.

The invention claimed is:

1. A semiconductor device comprising: a variable resistance first switch which includes a first terminal and a second terminal and whose resistive state changes when a predetermined condition is satisfied after electric power is applied,
a variable resistance second switch which includes a third terminal and a fourth terminal and configures an intermediate node by connecting the third terminal and the second terminal, and whose resistive state changes when a predetermined condition is satisfied after electric power is applied,
a first wiring which is connected to the first terminal,
a second wiring which is connected to the fourth terminal and extends in a direction intersecting with the first wiring in a planar view,
a first selection switch element which is connected to the first wiring, and
a second selection switch element which is connected to the second wiring, wherein a current or a voltage at the intermediate node is controlled,
wherein an intermediate node selection circuit which changes a state of connection between an intermediate node control signal line that transmits a signal for controlling the voltage or the current of the intermediate node and the intermediate node is further provided for the intermediate node, and wherein the intermediate node selection circuit changes the state of the connection between the intermediate node control signal line and the intermediate node based on a signal from a first decode signal line connected to the first selection switch element and a signal from a second decode signal line connected to the second selection switch element.

2. The semiconductor device according to claim 1, wherein
at least either a set of the first wiring, the first selection switch element, and a first decode signal line connected to the first selection switch element or a set of the second wiring, the second selection switch element, and a second decode signal line connected to the second selection switch element is plurally provided and
an array unit in which a plurality of unit elements, each of which is composed of the first switch and the second switch, are arranged at intersections of the first wiring and the second wiring in a matrix shape is included.

3. The semiconductor device according to claim 2, wherein
a first programming driver connected to the first wiring via the first selection switch element and a second programming driver connected to the second wiring via the second selection switch element are further included and the semiconductor device has at least either a configuration in which the first programming driver is connected to a plurality of the first selection switch elements or a configuration in which the second programming driver is connected to a plurality of the second selection switch elements.

4. The semiconductor device according to claim 1, wherein the semiconductor device has a configuration in which at least either a set of the first wiring, the first selection switch element, and the first decode signal line connected to the first selection switch element or a set of the second wiring, the second selection switch element, and the second decode signal line connected to the second selection switch element is plurally provided, an intermediate node programming driver connected to the intermediate node via the intermediate node selection circuit is further provided, and the intermediate node programming driver is connected to a plurality of the intermediate node selection circuits.

5. The semiconductor device according to claim 4, wherein the intermediate node selection circuit includes a decode circuit which is one of an AND circuit, an OR circuit, an NAND circuit, and an NOR circuit and receives the signal from the first decode signal line and the signal from the second decode signal line as an input signal and an intermediate node selection switch element which changes the state of the connection between the intermediate node control signal line and the intermediate node by the output signal of the decode circuit.

6. The semiconductor device according to claim 4, wherein the first selection switch element and the second selection switch element are transistors, the intermediate node selection circuit includes a first intermediate node selection transistor and a second intermediate node selection transistor which have the same type of channel as the first selection switch element and the second selection switch element, the first intermediate node selection transistor includes a fifth terminal, a sixth terminal, and a first gate terminal, the second intermediate node selection transistor includes a seventh terminal, an eighth terminal, and a second gate terminal, the fifth terminal is connected to the intermediate node control signal line, the sixth terminal and the seventh terminal are connected to each other, the eighth terminal is connected to the intermediate node, and one of the first gate terminal and the second gate terminal is connected to the first decode signal line and the other is connected to the second decode signal line.

7. The semiconductor device according to claim 6, wherein at least either a set of the first wiring, the first selection switch element, and the first decode signal line or a set of the second wiring, the second selection switch element, and the second decode signal line is plurally provided, an array unit in which a plurality of unit elements, each of which is composed of the first switch and the second switch, are arranged at intersections of the first wiring and the second wiring in a matrix shape is included, the second intermediate node selection transistor is provided in each of a plurality of the intermediate node selection circuits, and the first intermediate node selection transistor of one intermediate node selection circuit further operates as the first intermediate node selection transistor of at least one of the other intermediate node selection circuits and the first intermediate node selection transistor is connected to the second intermediate node selection transistor of the other intermediate node selection circuit.

8. The semiconductor device according to claim 1, wherein the first switch and the second switch are bipolarity type variable resistance elements and the second and third terminals that are connected to configure the intermediate node have polarities that are the same as each other.

9. A programming method comprising:

preparing a semiconductor device that includes a variable resistance first switch which has a first terminal and a second terminal and whose resistive state changes when a predetermined condition is satisfied after electric power is applied, and a variable resistance second switch which has a third terminal and a fourth terminal and configures an intermediate node by connecting the third terminal and the second terminal, and whose resistive state changes when a predetermined condition is satisfied after electric power is applied;

programming a unit element composed of the first switch and the second switch by applying a voltage or a current between the first terminal and the fourth terminal so that the first switch and the second switch satisfy the condition and by changing the resistive states of the first switch and the second switch; and controlling a current or voltage at the intermediate node, wherein the semiconductor device further includes an intermediate node selection circuit which changes a state of connection between an intermediate node control signal line that transmits a signal for controlling the voltage or the current of the intermediate node and the intermediate node for the intermediate node, and wherein the intermediate node selection circuit changes the state of the connection between the intermediate node control signal line and the intermediate node based on a signal from a first decode signal line connected to the first selection switch element and a signal from a second decode signal line connected to the second selection switch element and changes a resistive state of the first switch and a resistive state of the second switch individually.

10. The programming method according to claim 9, wherein in the semiconductor device, at least either a set of the first wiring, the first selection switch element, and a first decode signal line connected to the first selection switch element or a set of the second wiring, the second selection switch element, and a second decode signal line connected to the second selection switch element is plurally provided, an array unit in which a plurality of unit elements, each of which is composed of the first switch and the second switch, are arranged at intersections of the first wiring and the second wiring in a matrix shape is included, and the unit element that is a programming target is uniquely selected by performing switching between a signal from the first decode signal line and a signal from the second decode signal line.

11. The programming method according to claim 10, wherein the semiconductor device further includes a first programming driver connected to the first wiring via the first selection switch element and a second programming driver connected to the second wiring via the second selection switch element,
  has at least either a configuration in which the first programming driver is connected to a plurality of the first selection switch elements or a configuration in which the second programming driver is connected to a plurality of the second selection switch elements, and
  controls a voltage or a current applied to the unit element based on a signal from the first programming driver and a signal from the second programming driver.

12. The programming method according to claim 9, wherein
  the semiconductor device has a configuration in which
  at least either a set of the first wiring, the first selection switch element, and the first decode signal line connected to the first selection switch element or a set of the second wiring, the second selection switch element, and the second decode signal line connected to the second selection switch element is plurally provided,
  an intermediate node programming driver connected to the intermediate node via the intermediate node selection circuit is further included, and
  the intermediate node programming driver is connected to a plurality of the intermediate node selection circuits, and
  the intermediate node selection circuit
  controls the voltage or the current applied to the first switch based on the signal from the first programming driver and the signal from the intermediate node programming driver and
  controls the voltage or the current applied to the second switch based on the signal from the second programming driver and the signal from the intermediate node programming driver.

13. The programming method according to claim 9, wherein
  the intermediate node selection circuit includes
  a decode circuit which is one of an AND circuit, an OR circuit, an NAND circuit, and an NOR circuit and receives the signal from the first decode signal line and the signal from the second decode signal line as an input signal and
  an intermediate node selection switch element which changes the state of the connection between the intermediate node control signal line and the intermediate node by the output signal of the decode circuit.

14. The programming method according to claim 9, wherein
  the first selection switch element and the second selection switch element are transistors,
  the intermediate node selection circuit includes a first intermediate node selection transistor and a second intermediate node selection transistor which have the same type of channel as the first selection switch element and the second selection switch element,
  the first intermediate node selection transistor includes a fifth terminal, a sixth terminal, and a first gate terminal,
  the second intermediate node selection transistor includes a seventh terminal, an eighth terminal, and a second gate terminal,
  the fifth terminal is connected to the intermediate node control signal line,
  the sixth terminal and the seventh terminal are connected to each other,
  the eighth terminal is connected to the intermediate node, and
  one of the first gate terminal and the second gate terminal is connected to the first decode signal line and the other is connected to the second decode signal line, and
  the first intermediate node selection transistor and the second intermediate node selection transistor change the state of the connection between the intermediate node control signal line and the intermediate node based on the signal from the first decode signal line and the signal from the second decode signal line.

15. The programming method according to claim 14, wherein
  the semiconductor device has a configuration in which
  at least either a set of the first wiring, the first selection switch element, and the first decode signal line or a set of the second wiring, the second selection switch element, and the second decode signal line is plurally provided,
  an array unit in which a plurality of unit elements, each of which is composed of the first switch and the second switch, are arranged at intersections of the first wiring and the second wiring in a matrix shape is included,
  the second intermediate node selection transistor is provided in each of a plurality of the intermediate node selection circuits, and
  the first intermediate node selection transistor of one intermediate node selection circuit further operates as the first intermediate node selection transistor of at least one of the other intermediate node selection circuits and the first intermediate node selection transistor is connected to the second intermediate node selection transistor of the other intermediate node selection circuit.

16. The programming method according to claim 9, wherein
  the first switch and the second switch are bipolarity type variable resistance elements and
  the intermediate node is configured by connecting the terminals of the unit elements, each of which is composed of the first switch and the second switch, whose polarities are the same as each other.

* * * * *